(12) United States Patent
Hsu

(10) Patent No.: US 6,382,306 B1
(45) Date of Patent: May 7, 2002

(54) GEOMETRICAL STREAMLINE FLOW GUIDING AND HEAT-DISSIPATING STRUCTURE

(76) Inventor: Hul Chun Hsu, 6F-3, No. 422, Sec. 2, Lin Ming Rd., Tai Chung (TW)

( * ) Notice: Subject to any disclaimer, the term of this patent is extended or adjusted under 35 U.S.C. 154(b) by 0 days.

(21) Appl. No.: 09/639,276

(22) Filed: Aug. 15, 2000

(51) Int. Cl.7 .................................................. F28F 7/00
(52) U.S. Cl. ............................. 165/80.3; 165/104.33; 165/185; 165/104.26; 165/125; 165/361; 165/700; 165/704; 165/257; 165/715; 165/722
(58) Field of Search ......................... 165/80.3, 104.21, 165/125, 185, 121, 104.33, 104.26; 257/719, 718, 722, 715, 720; 361/700, 697, 704

(56) References Cited

U.S. PATENT DOCUMENTS

| | | | | |
|---|---|---|---|---|
| 4,823,869 A | * | 4/1989 | Arnold et al. | 165/185 |
| 5,597,034 A | * | 1/1997 | Baker, III et al. | 165/185 |
| 5,694,295 A | * | 12/1997 | Mochizuki et al. | 165/104.33 |
| 5,884,692 A | * | 3/1999 | Lee et al. | 165/185 |
| 6,196,300 B1 | * | 3/2001 | Checchetti | 165/80.3 |

* cited by examiner

Primary Examiner—Christopher Atkinson
(74) Attorney, Agent, or Firm—Rosenberg, Klein & Lee

(57) ABSTRACT

A geometrical streamline flow guiding and heat-dissipating structure is formed by a heat-transferring seat, a heat-dissipating device and a fan. The heat-transferring seat has at least one heat conductive surface for being connected to the heat source. The heat-transferring seat further has at least one heat-transferring seat for heat dissipation with the radiating surface. The radiating surface has a three dimensional form, i.e. one side of the radiating surface is higher than another side thereof so as to be beneficial to guide the airflow. The heat-transferring seat is covered with the heat-dissipating device having a shape matching with the bottom thereof. The heat-transferring seat is formed by many pieces or is formed by a continuous folded structure, or is formed integrally through die casting, forging or slitting. The heat-dissipating device is buckled to the heat source through a buckle; the heat-dissipating device is connected to the fan. The fan serves to guide air into the heat-dissipating device; by the guiding of the heat-dissipating device and the radiating surface of the heat-transferring seat, air flows along streamline paths.

16 Claims, 12 Drawing Sheets

GEOMETRICAL STREAMLINE FLOW GUIDING AND HEAT-DISSIPATING STRUCTURE

FIELD OF THE INVENTION

The present invention relates to a geometrical streamline flow guiding and heat-dissipating structure, and especially to a three dimensional airflow guide structure.

BACKGROUND OF THE INVENTION

Microelectronic devices, especially chips used in microprocessor, are used widely, while those with higher operation speed need a better heat-dissipating ability. Since in general, a chip must be switched over one million times in one second, therefore, large heat is generated in the packaging layer. Therefore, all the central processing unit (CPU) in a computer has a heat-dissipating device for exhausting heat. When a new center processing unit is developed, a preferred heat-dissipating device required so as to assist the CPU to dissipate heat. Therefore, it is apparent that heat-dissipating device is necessary.

In the prior art way for resolving the problem of heat dissipation, only radiating block is used or only fan is used, but afterwards, a combination structure is developed. At first, a radiating block is in contact with the surface of a chip and then a fan is connected to the lateral side or upper side of the radiating block, and thus a top blowing or lateral blowing heat dissipation structure is formed. This is a main trend in the current heat-dissipating device. By using these two components, there are many heat-dissipating devices are disclosed. Referring to FIG. 1, a prior art spiral heat guide is illustrated. The guide has a rectangular structure and is matched to the size of a CPU. The bottom of the guide is connected to the CPU. The heat from the CPU is exhausted from the guide. The most original structure is radiating sheets formed by folding an aluminum sheet. The fins are used for dissipating heat. Afterwards, fan is installed in the guide. The fan serves to guide air for further exhausting heat. Such a structure is suitably used to a personal computer, but not suitable to a notebook computer. In order to reduce the thickness, an embedded type fan shown in FIG. 1 is illustrated, which is matched with cambered wind guide at the periphery. The defect is that the air flow will be interrupted between the guiding strips, and noise is generated so as to reduce the heat dissipation, Moreover, a further defect is the axial fan must guide cool air from an upper side. When the cool air flows downwards, it will impact the contact surface between the guide and the fan. An interruption occurs between air flow and blades of the fan so as to interfere the smoothness of the air flow and the effect in use is reduced. Namely, the prior art guide structure is a plane structure. Since it forms a vertical guide and is not a perfect structure, the effect of air exhaustion can be seen from FIG. 1. It provides an initial resolving way to dissipate heat. However, the prior art guide structure does not serve for requirement of resolving the problems of turbulent flow and noise, and thus, a novel design is required to solve the heat dissipation in novel electronic device.

SUMMARY OF THE INVENTION

Accordingly, the primary object of the present invention is to provide a geometrical streamline flow guiding and heat-dissipating structure for resolving the problem in the prior art, wherein the air flows in the radiating fins through a right angle flow path so as to generate the interruption of airflow. The present invention provides a geometrical streamline heat-transferring seat. The difference of elevation in the heat-transferring seat induces a potential difference so that air flows along the radiating surface of streamline without any right angle flow path. Air above the heat-dissipating device is firstly drawn by the fan and then flows downwards through a right angle flow path. While as the air blows to the radiating surface of the heat-transferring seat, it will flow along streamlines without any right angle path so that air is exhausted outwards. Therefore, the dead points in the flow path of the prior art can be avoided and thus, the interruption in the dead point is removed. Thus, air flows more successfully with a shorter flow path and the exhausting speed is quicker. The present invention is a useful flow guide structure. The turbulent flow due to the radiating strips in the prior art will not occur. Furthermore, by further guide of the radiating sheets, air is guided naturally Therefore, the present invention provides a very practical structure for guiding air. The guide structure of the present invention has a larger upper portion and a small lower portion. The heat nearest the bottom can be exhausted greatly so as to generate a preferred heat dissipation effect. Besides, in the present invention, the heat-transferring seat is well designed so that the heat in the heat source can be exhausted easily.

In order to achieve the aforesaid object, the present invention provides a geometrical streamline flow guiding and heat-dissipating structure which is formed by a heat-transferring seat, a heat-dissipating device and a fan. The heat-transferring seat has at least one heat conductive surface for being connected to the heat source. The heat-transferring seat further has at least one heat-transferring seat for heat dissipation with the radiating surface. The radiating surface has a three dimensional form, i.e. one side of the radiating surface is higher than another side thereof so as to be beneficial to guide the airflow. The heat-transferring seat is covered with the heat-dissipating device having a shape matching with the bottom thereof. The heat-transferring seat is formed by many pieces or is formed by a continuous folded structure, or is formed integrally through die casting, forging or slitting. The heat-dissipating device is buckled to the heat source through the buckle; the heat-dissipating device is connected to the fan. The fan serves to guide air into the heat-dissipating device. By the guiding of the heat-dissipating device and the radiating surface of the heat-transferring seat, air flows along streamlines.

The various objects and advantages of the present invention will be more readily understood from the following detailed description when read in conjunction with the appended drawing.

DETAILED DESCRIPTION OF THE PREFERRED EMBODIMENTS

Figure 1:
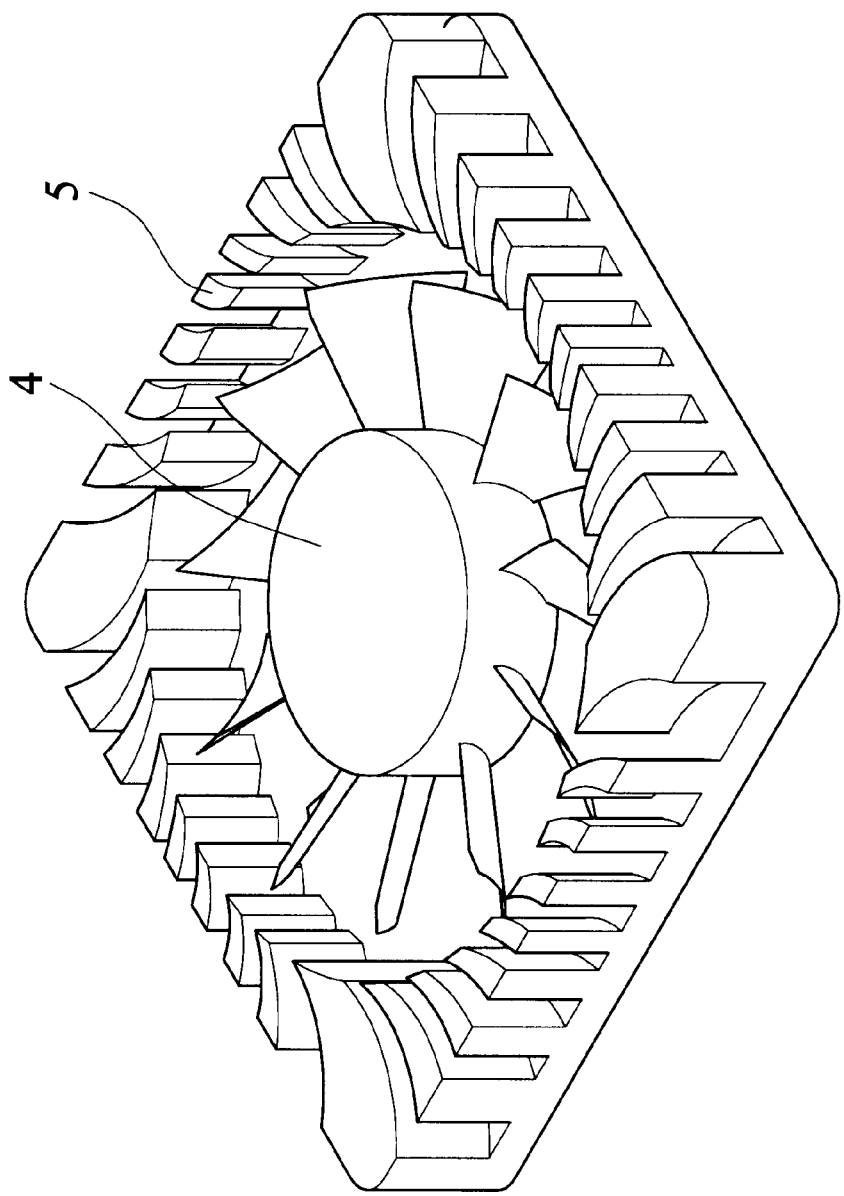
FIG. 1 is a perspective view of a prior art design.
Figure 2:
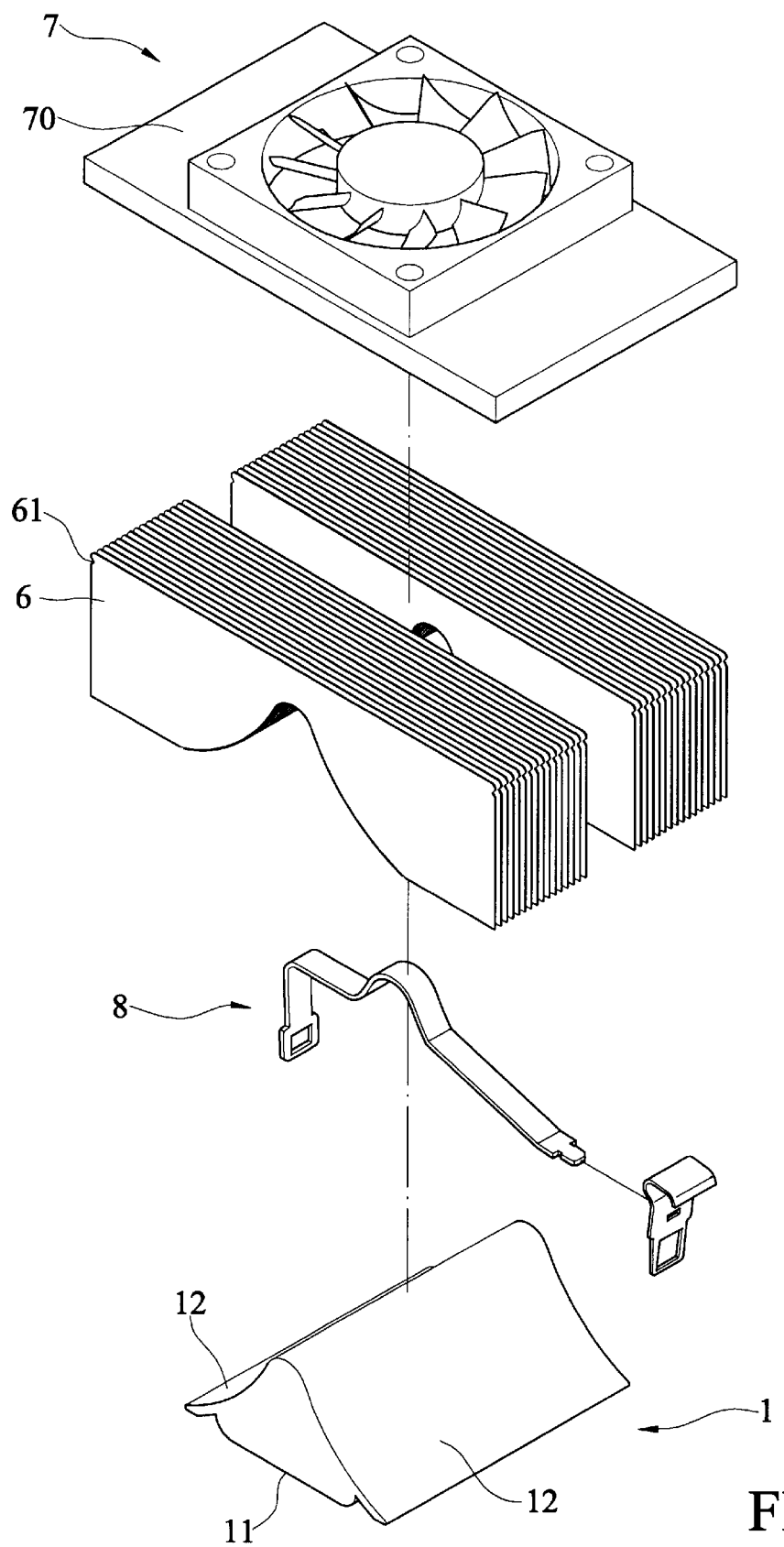
FIG. 2 is an exploded perspective view of the first embodiment in the present invention.
Figure 5:
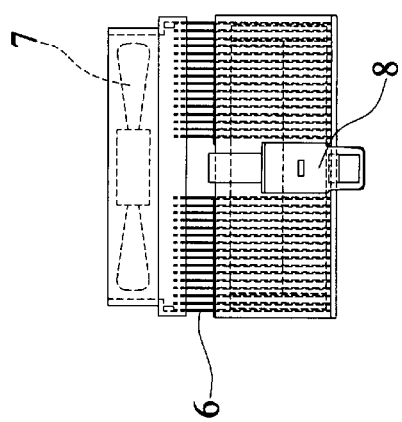
FIG. 5 shows a right side view of the first embodiment according to the present invention.
Figure 6:
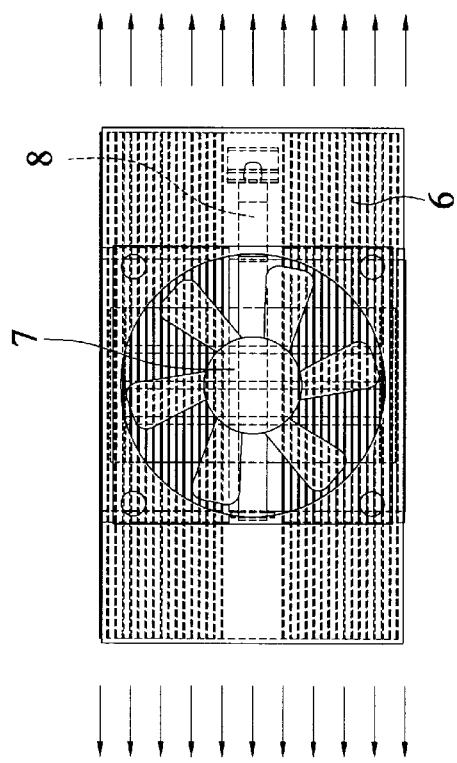
FIG. 6 is an upper view of the first embodiment in the present invention.

Referring to FIGS. 2 to 23, the geometrical streamline flow guiding and heat-dissipating structure of the present invention is illustrated. The heat-dissipating structure installed a heat-transferring seat 1, a heat-dissipating device 6 and a fan 7. The heat-transferring seat 1 has at least one heat conductive surface 11 and a heat source 2. In general, the heat source 2 is an electronic element, for example, a central processing unit CPU. The heat-transferring seat 1 further has at least one radiating surface 12. The radiating surface 12 serves to radiate heat and to guide airflow to be exhausted. The radiating surface 12 is a three dimensional structure including one of the tilt surface, cambered surface, tapered surface or a curved surface. Namely, one side of the radiating surface 12 is high, while other side is low. This design is beneficial to guide airflow. The heat-transferring seat 1 is covered with a heat-dissipating device 6 having a shape matching with that of the heat-transferring seat 1. The heat-dissipating device 6 is formed by a plurality of radiating pieces (as shown in the figures) or formed by a folding sheet. The heat-dissipating device 6 can be formed integrally. Therefore, the heat-transferring seat 1 and the heat-dissipating device can be formed integrally and made by die casting, forging, slitting, etc. the heat-dissipating device 6 is buckled to the heat source 2 through a buckle 8. The top of the heat-dissipating device 6 is a plane for being connected to the fan 7. The fan 7 serves to guide air into the heat-dissipating device 6. By the guiding of the heat-dissipating device 6 and the radiating surface 12 of the heat-transferring seat, air flows along streamlines. The heat-transferring seat is a solid body or a hollow body. If it is a hollow body, it may be a heat pipe or is inserted by heat pipes. Supports can be installed in the hollow heat-transferring seat 1.

Figure 3:
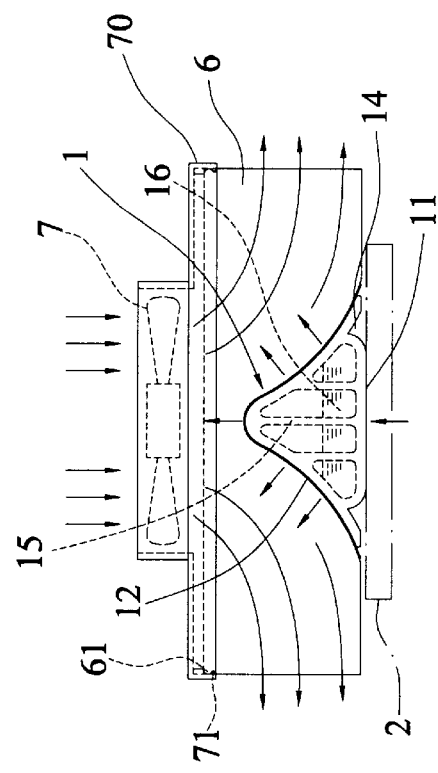
FIG. 3 is a front view of the first embodiment in the present invention.
Figure 4:
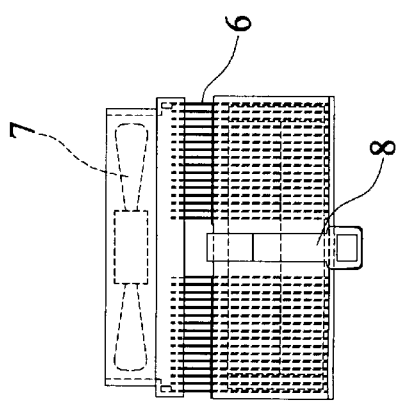
FIG. 4 shows a left side view of the first embodiment in the present invention.
Figure 7:
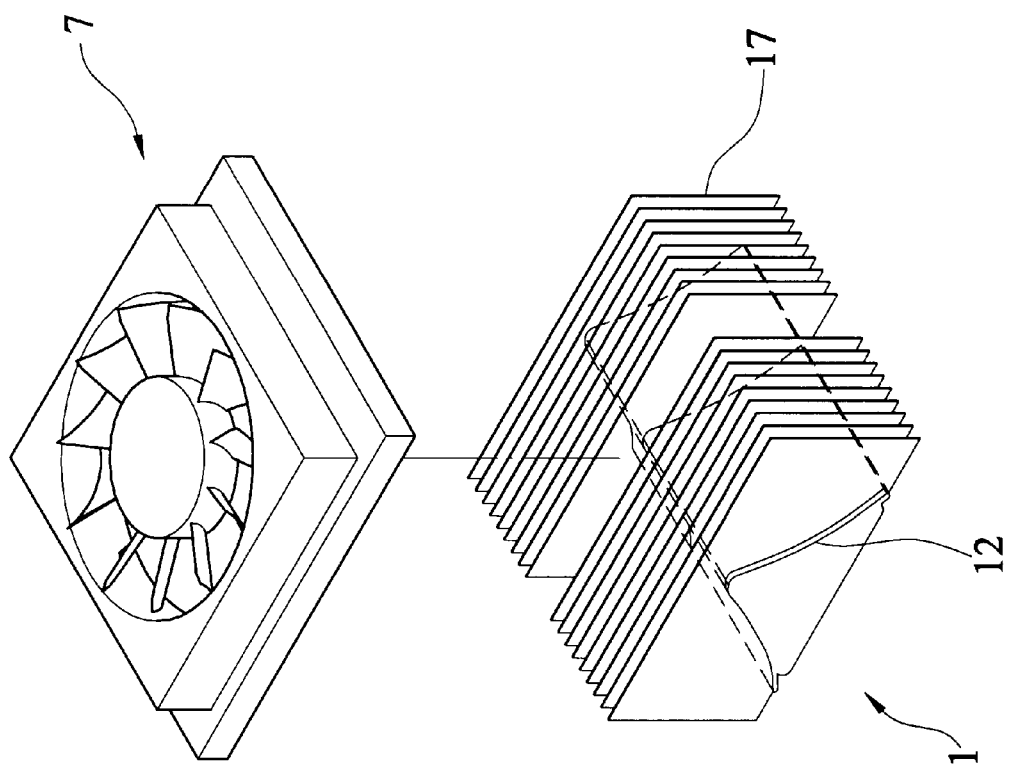
FIG. 7 is an exploded perspective view of the second embodiment in the present invention.

The first embodiment of the present invention is illustrated in FIGS. 2 to 6, a heat-transferring seat 1 of a triangular cylinder is illustrated, which is in contact with a heat source 2. The radiating surfaces 12 at two sides of the heat-transferring seat 1 of triangular cylinder are cambered surfaces. The bottom thereof is a radiating surface 11 to be in contact with the heat source 2. The heat-transferring seat 1 is a hollow body. The interior thereof is installed with ribs 15 as supports to enhance the structure, i.e. the ribs are used as supporting posts. Meanwhile, the radiating surface 11 at the bottom has a plurality of grooves 14. The interior of the heat-transferring seat 1 contains with liquid 16, namely, it is formed with a heat pipe. The heat-dissipating device 6 is formed as fins. That is, the lower half of the heat-dissipating device 6 is formed with a convex cambered portion matching to a concave cambered portion of the radiating surface 12. Similarly, the buckle 8 has a shape matching to the heat-transferring seat 1. Two lateral sides of the heat-dissipating device 6 are installed with a concave portion 61 for matching to the buckling point 71 at an edge of a fixing mask 70 of the fan 7. Namely, the buckling point 71 is buckled to the concave portion 61 so that the fixing mask 70 of the fan 7 is buckled to the top of the heat-dissipating device 6. In order to be more steadily connected to the fan, the top of the heat-dissipating device 6 is slightly higher than the top end of the heat-transferring seat 1 and is flat for bearing the fan 7. FIG. 3 shows that the radiating surface 11 of the heat-transferring seat 1 which guides the heat from the heat source along the direction indicated by the arrow and then is exhausted along the direction indicated by the arrow through the radiating surface 12. Meanwhile, the fan 7 draws air in the upper side toward the heat-dissipating device 6 as that illustrated by the arrow, and then air flows along the radiating surface 12 and then along the streamline flow path of each radiating piece. Since in the aforesaid embodiment, the heat-dissipating device 6 is separated with the heat-transferring seat 1, while in the second embodiment, fins 17 can be directly formed integrally on the surface of the heat-transferring seat 1 for dissipating heat and guiding air. The form of the fins are similar to that illustrated in the aforesaid embodiment.

Figure 9:
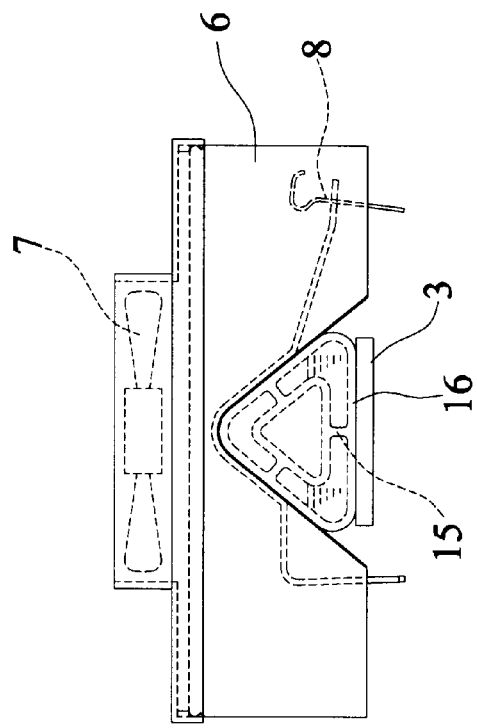
FIG. 9 is a front view of the fourth embodiment in the present invention.
Figure 8:
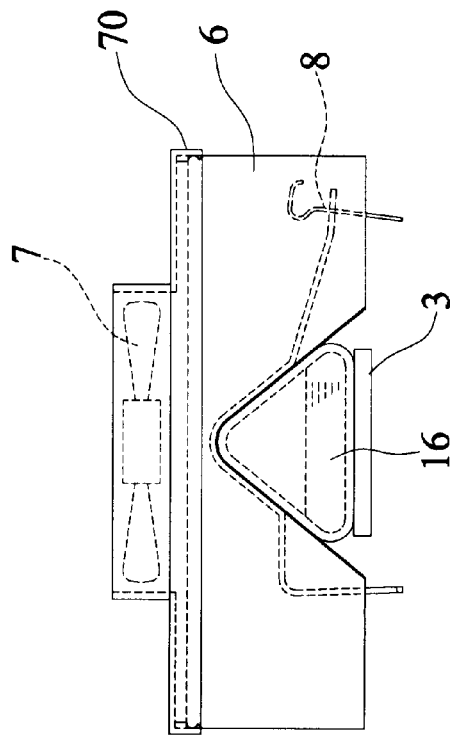
FIG. 8 shows a front view of the third embodiment in the present invention.

FIGS. 8 to 12 illustrate the third to seventh embodiments of the present invention. These embodiments have similar constructions except that the structures of the heat-transferring seats are different. In FIG. 8, the heat-transferring seat 1 is a hollow body, and appearance is a triangular cylinder. Liquid contains in the heat-transferring seat 1 so as to be retained as a heat pipe. The bottom of the heat-transferring seat is connected to a radiating block 3. The heat-transferring seat is connected to the heat source through the radiating block. The heat-transferring seat 1 in FIG. 9 is similar to that in the FIG. 8 except liquid 16 is contained between an inner layer and an outer layer. Between the inner layer and the outer layer is hollowed.

Figure 11:
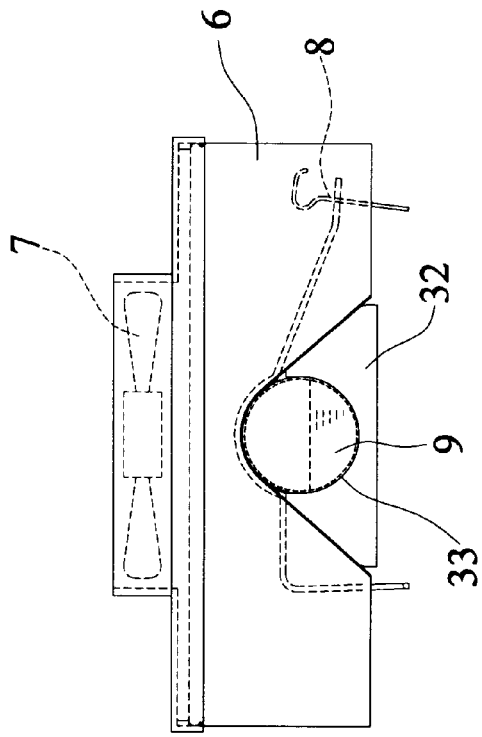
FIG. 11 is a front view of the sixth embodiment of the present invention.
Figure 10:
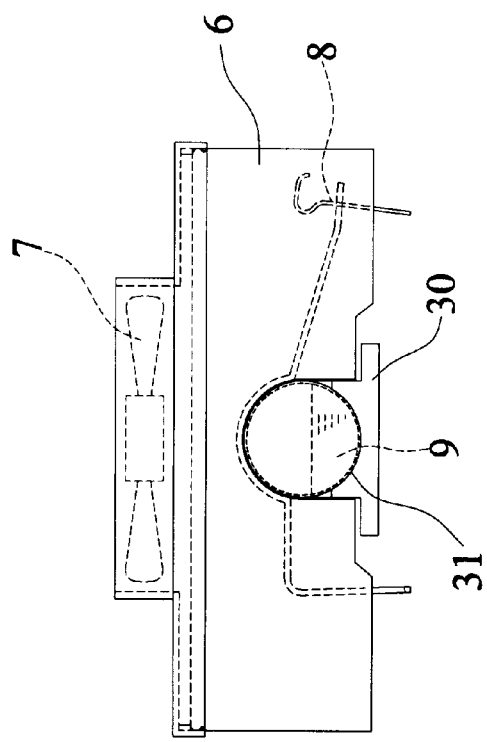
FIG. 10 is a front view of the fifth embodiment of the present invention.
Figure 12:
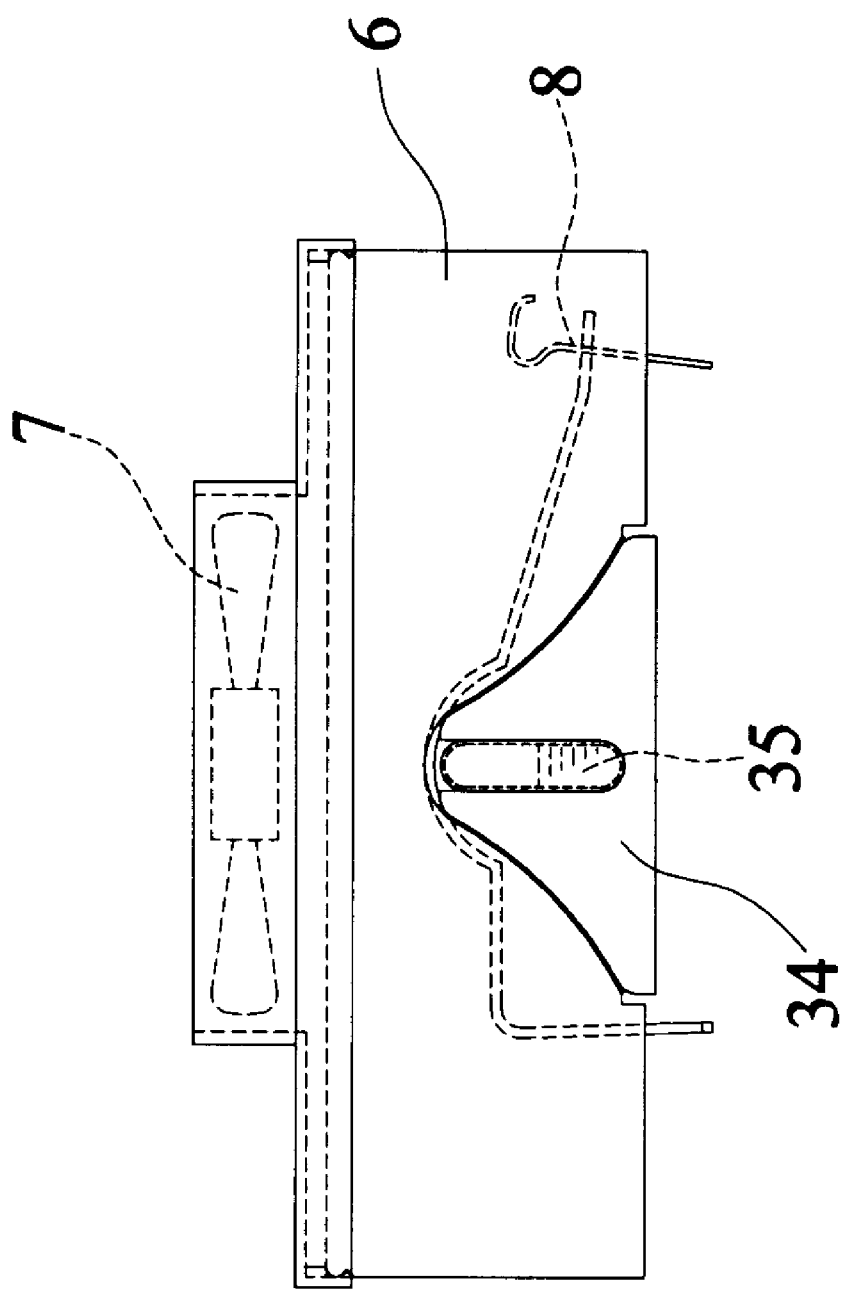
FIG. 12 is a front view of the seventh embodiment of the present invention.

The exception in FIG. 10 is that a heat pipe 9 is placed upon a stepped radiating block 30. That is, the heat-transferring seat 1 is like a round tube, moreover, the seat 31 of the stepped radiating block 31 locating the heat pipe 9 is a compound type. The embodiment shown in FIG. 11 is similar to that in FIG. 10, a compound type heat-transferring seat is illustrated herein. A triangular radiating block 32 is formed as a main body of the heat-transferring seat 1 and a heat pipe 9 passes through a cambered seat 33. The embodiment illustrated in FIG. 12 is similar to that illustrated in FIG. 10, a triangular concave cambered radiating block 34 is formed, and a groove seat 35 is installed therein for being placed with a flat heat pipe 90. From the aforesaid five embodiments of the heat-transferring seat 1, it is appreciated that the heat-transferring seat 1 can be a compound type.

Figure 14:
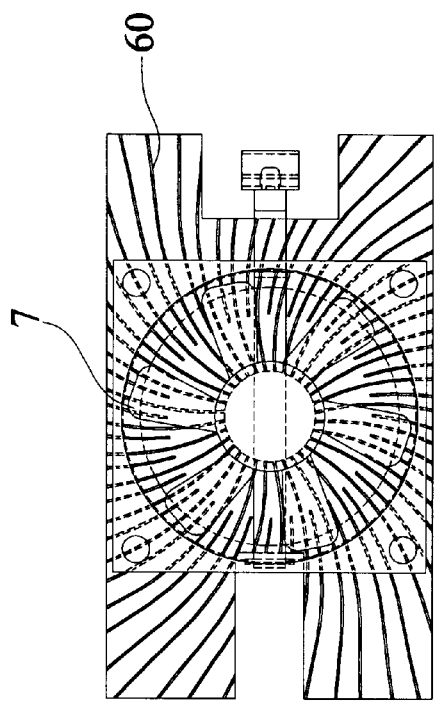
FIG. 14 is an upper view of the eighth embodiment of the present invention.
Figure 13:
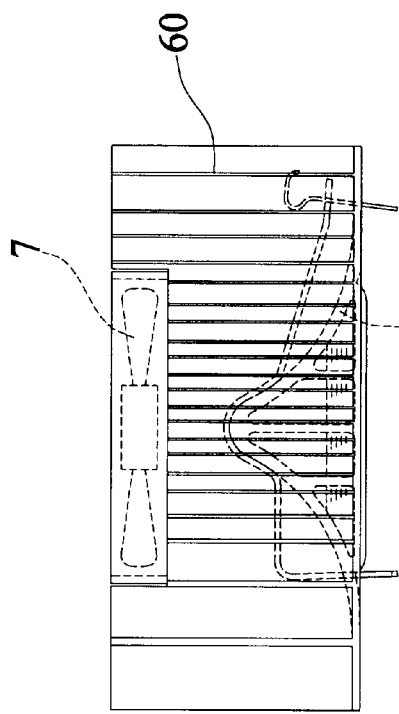
FIG. 13 is a front view of the eighth embodiment of the present invention.
Figure 16:
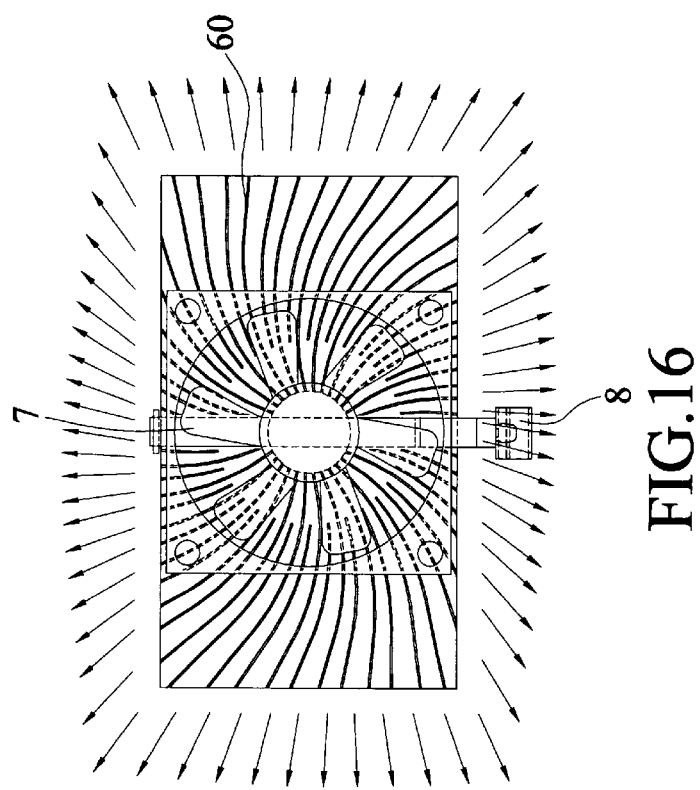
FIG. 16 is an upper view of the ninth embodiment of the present invention.
Figure 17:
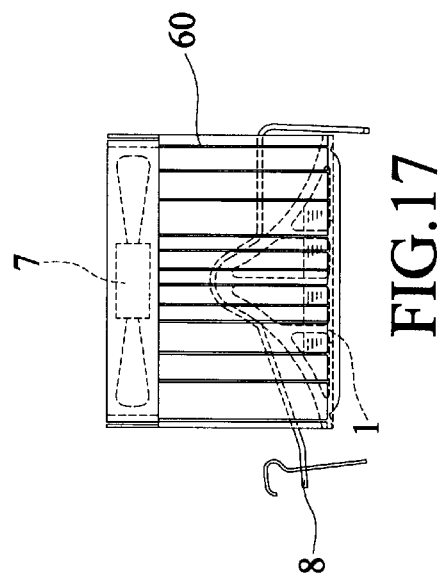
FIG. 17 is a right view of the ninth embodiment of the present invention.
Figure 15:
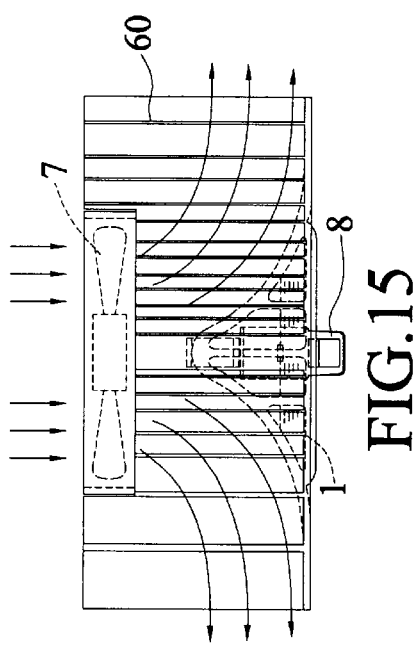
FIG. 15 is a front view of the ninth embodiment of the present invention.
Figure 18:
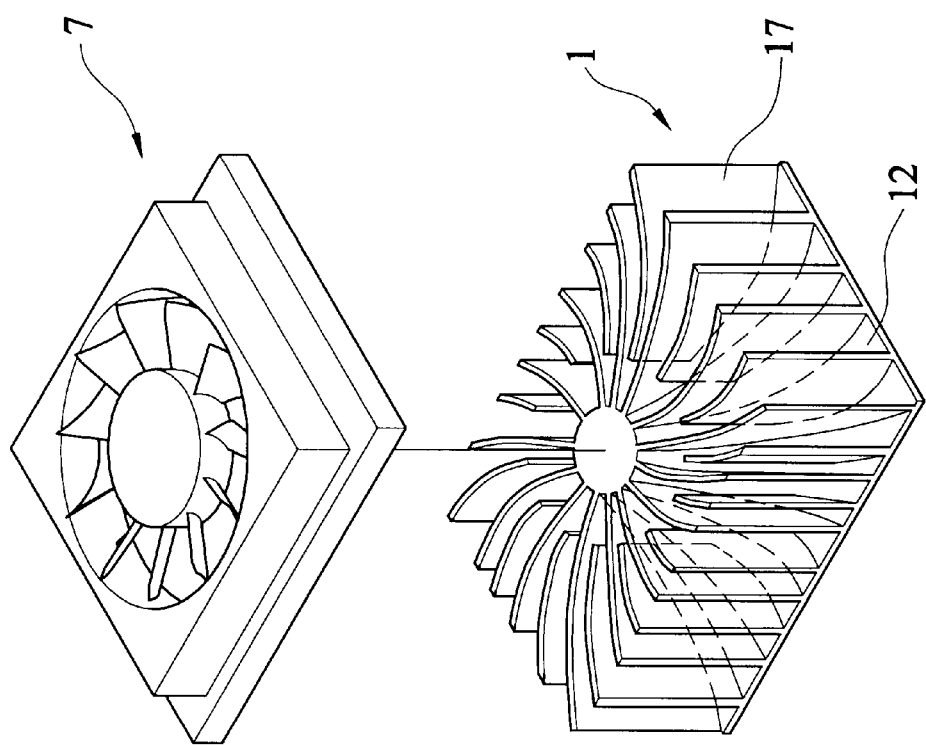
FIG. 18 is a perspective view of the tenth embodiment in the present invention.

The eighth embodiment illustrated in FIGS. 13 and 14 illustrates a heat-transferring seat 1 identical to that illustrated in first embodiment except that a spiral heat-dissipating device 60 is installed, which is different from the fins in first embodiment. The air flow may flow forwards, backwards, leftwards or rearwards. The fan 7 is embedded in the spiral heat-dissipating device 60 for forming a larger heat radiating area. The three lateral views of the ninth embodiment of the present invention are illustrated in FIGS. 15 to 17. This embodiment is similar to the eighth embodiment, only the retaining orientation of the buckle 8 is different from that in eighth embodiment. The tenth embodiment is illustrated in FIG. 18 which has a perspective view similar to that shown in ninth embodiment. However, the tenth embodiment has an integral formed heat-transferring seat 1, which is similar to the second embodiment but with spiral fins 17.

Figure 20:
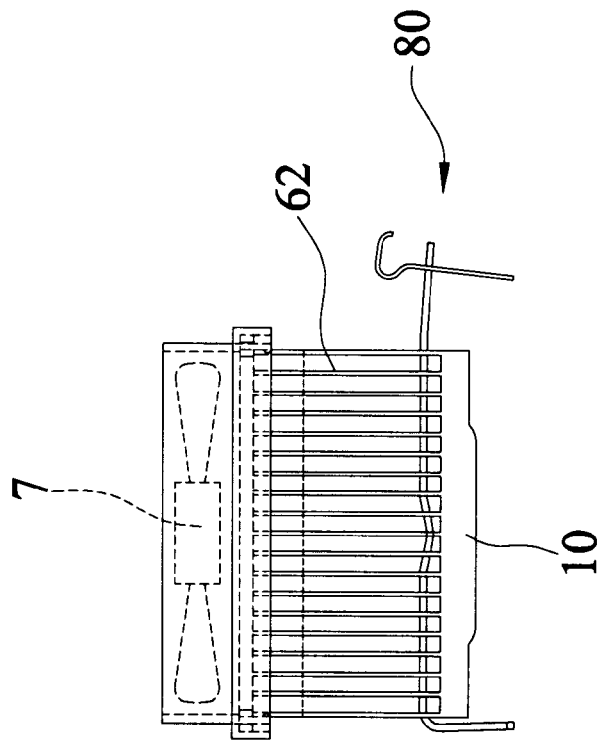
FIG. 20 is a right side view of the eleventh embodiment in the present invention.
Figure 19:
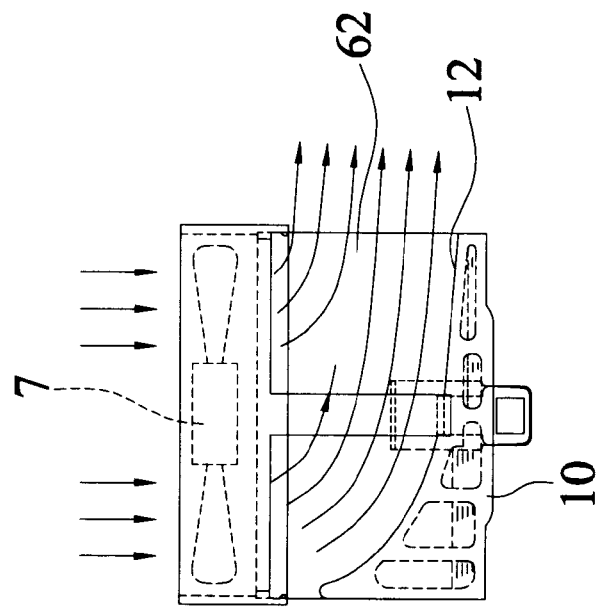
FIG. 19 is a front view of the eleventh embodiment in the present invention.

The eleventh embodiment of the present invention is illustrated FIGS. 19 and 20, a heat-transferring seat 10 with a right triangular with concave cambered surfaces is shown. Namely, the first embodiment shows a structure with two concave cambered surfaces, while in the eleventh embodiment, a structure with one concave cambered surface is shown. The heat-dissipating device 62 in eleventh embodiment are formed with fins. The upper side of the heat-dissipating device 62 has a fan 7. The heat-dissipating device 6 is fixed by a buckle 80 so that airflow is guided unidirectionally. Therefore, it is appreciated that the heat-dissipating device may be formed by one of the straight type, a spiral type, and a helical type. The heat-dissipating device is made by folding a radiating sheet to be formed as radiating pieces. Since the fan is installed with notches to be beneficial for airflow. The heat-dissipating device may be formed by a single radiating fin. Each fin can be formed with pits for assembly and use. Moreover, the heat-dissipating device may be combined with the heat-transferring seat by one of known ways.

Figure 23:
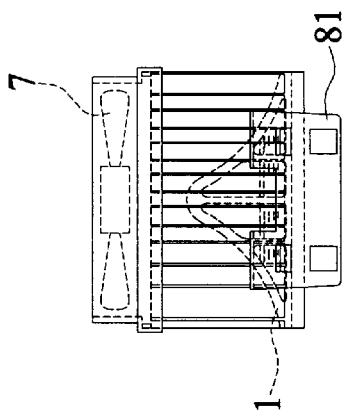
FIG. 23 is a right side view of the twelfth embodiment of the present invention.
Figure 22:
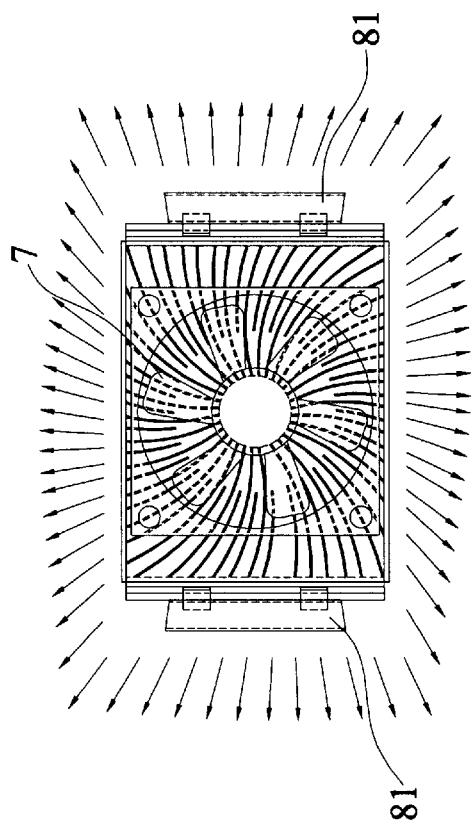
FIG. 22 is an upper view of the twelfth embodiment of the present invention.
Figure 21:
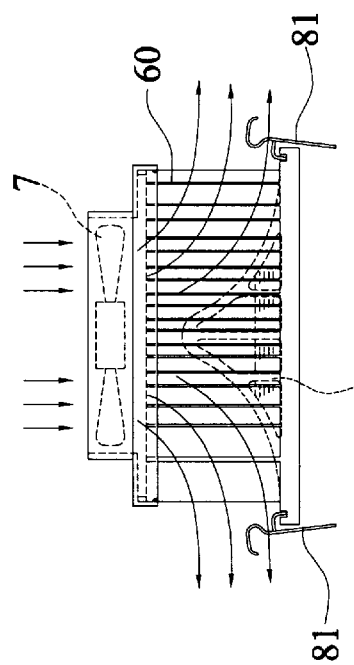
FIG. 21 is a front view of the twelfth embodiment of the present invention.

Three views of the twelfth embodiment are illustrated in FIGS. 21 to 23. It is shown that the structure in this embodiment is similar to that in ninth embodiment except that the width is narrower and a lateral buckle 81 buckled from two sides is installed.

The radiating surface 12 may be one of tilt surfaces, cambered surfaces, tapered surfaces or curved surfaces, or the combination thereof. In the aforesaid embodiment, the heat-transferring seats 1 are a hollow body and mainly have a form of heat pipe. However, the present invention is not confined to the aforesaid embodiments. Since the heat-transferring seat 1 has a hollow body and has a plurality of ribs as support. Other than to support the inner space of the heat-transferring seat 1, the ribs have the advantage of heat transfer in the inner space. When the heat-transferring seat is a heat pipe, the ribs can be used independently or are communicated with one another. All these designs are beneficial to the heat transfer in the interior of the heat pipe. Furthermore, forming the heat-transferring seat as a heat pipe has the advantage of reducing cost. The heat-transferring seat is a hollow body with enhancing ribs, and further, it has a structure of heat pipe with a preferred heat conductivity. The hollow inner space in the heat-transferring seat may reduce the weight, and the volume thereof can be made larger or smaller as desired. It may be well matched with the heat source so as to be formed with a strong support. Therefore, the heat-transferring seat having a form of heat pipe is hard to deform due to outer pressure or inner vacuum.

Moreover, contact thermal resistance is decreased. Furthermore, because of the enhancing structure, the thickness of the housing of the heat-transferring seat is thinner, this further reduces the conductive heat resistance. Therefore, the whole effect is improved.

In summary, by the tilt surface, camber surface and curved surface of the present invention, a cubic structure different from the prior art design is formed, i.e., a three-dimensional guide is formed. The wind flows along single surface, double surface and all surfaces of the heat-transferring seat. Moreover, the flow resistance is small. An airflow from upper side forms a direct guide along the radiating surface 12 of the present invention. It is different from the prior art in which air flows along a rectangular angle. Therefore, no dead point exists in using. A good use is provided. Air flows more successfully and the flow path is shorter. The speed for exhausting air is quicker. Therefore, the noise from the flow is small, air flows quickly with a rapid heat dissipation and thus, the heat dissipates with a preferred efficiency. No tail flow or turbulent flow generates. The overall heat transfer efficiency is better than that in the prior art. Since the flow resistance is small, a heat-dissipating device with more heat-dissipating pieces can be used and a fan driving a small wind flow can be used, while a better efficiency than the prior art can be achieved. Air is guided naturally. Moreover, the structure of the present invention generates a temperature distribution matching the distribution of temperature gradient. A guide of large flow in the upper side and small flow in the lower side is formed so that the heat near the lower end can be exhausted greatly. Thus, the present invention provides a good heat transfer path so as to induce a better heat-dissipating effect.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A geometrically streamlined structure for removing and dissipating heat generated by a source comprising:
   a heat transferring seat having at least one thermally conductive surface for contact with the source and at least one radiating surface for dissipating heat, said radiating surface describing a protuberant arcuate contour adapted to guide air flow thereover in streamlined manner;
   a heat dissipating device disposed over said heat transferring seat, said heat dissipating device having a bottom portion substantially conforming to said radiating surface of said heat transferring seat;
   a fan disposed adjacent said heat dissipating device, said fan being operable to direct air through said heat dissipating device; and, a buckle device for securing said heat transferring seat to the source.

2. The geometrically streamlined structure for removing and dissipating heat as recited in claim 1 wherein said protuberant contour of said radiating surface of said heat transferring seat includes at least one portion having a configuration selected from the group consisting of: an inclined surface, a cambered surface, a tapered surface, an undulatory curved surface.

3. The geometrically streamlined structure for removing and dissipating heat as recited in claim 1 wherein said heat transferring seat includes a solid body portion.

4. The geometrically streamlined structure for removing and dissipating heat as recited in claim 1 wherein said heat transferring seat includes a hollow body portion.

5. The geometrically streamlined structure for removing and dissipating heat as recited in claim 4 wherein said heat transferring seat further includes at least one heat pipe portion inserted within said hollow body portion.

6. The geometrically streamlined structure for removing and dissipating heat as recited in claim 4 wherein said heat transferring seat further includes at least one support disposed in said hollow body portion.

7. The geometrically streamlined structure for removing and dissipating heat as recited in claim 4 wherein a liquid is contained in said hollow body portion of said heat transferring seat.

8. The geometrically streamlined structure for removing and dissipating heat as recited in claim 7 wherein said heat transferring seat defines a heat pipe.

9. The geometrically streamlined structure for removing and dissipating heat as recited in claim 1 wherein said heat transferring seat includes at least one radiating block portion and at least one heat pipe portion disposed thereon, said radiating block defining said thermally conductive surface, at least one of said radiating block and heat pipe portions at least partially defining said radiating surface.

10. The geometrically streamlined structure for removing and dissipating heat as recited in claim 1 wherein said heat dissipating device includes a plurality of fins each describing a contour selected from the group consisting of: a flat planar contour, a spirally undulatory contour, and a helically undulatory contour.

11. The geometrically streamlined structure for removing and dissipating heat as recited in claim 1 wherein said heat transferring seat is integrally formed, said heat transferring seat having at least one folded portion.

12. The geometrically streamlined structure for removing and dissipating heat as recited in claim 1 further comprising a fixing mask securing said fan to said heat dissipating device.

13. The geometrically streamlined structure for removing and dissipating heat as recited in claim 1 wherein said fan is disposed in at least partially recessed manner within said heat dissipating device.

14. The geometrically streamlined structure for removing and dissipating heat as recited in claim 1 wherein said heat transferring seat and said heat dissipating device are integrally joined.

15. The geometrically streamlined structure for removing and dissipating heat as recited in claim 1 wherein said heat transferring seat is formed with a structural configuration selected from the group consisting of: a die-cast structure, a forged structure, and a slit structure.

16. The geometrically streamlined structure for removing and dissipating heat as recited in claim 1 wherein said heat dissipating device is formed with a structural configuration selected from the group consisting of: a die-cast structure, a forged structure, and a slit structure.

* * * * *